United States Patent
Roy et al.

(10) Patent No.: US 9,449,703 B1
(45) Date of Patent: Sep. 20, 2016

(54) SYSTEMS AND METHODS FOR DRIVING A CONTROL GATE WITH A SELECT GATE SIGNAL IN A SPLIT-GATE NONVOLATILE MEMORY CELL

(71) Applicant: FREESCALE SEMICONDUCTOR, INC., Austin, TX (US)

(72) Inventors: Anirban Roy, Austin, TX (US); Jon S. Choy, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/734,736

(22) Filed: Jun. 9, 2015

(51) Int. Cl.
G11C 16/04 (2006.01)
G11C 16/08 (2006.01)
G11C 5/14 (2006.01)
G11C 16/30 (2006.01)

(52) U.S. Cl.
CPC .............. *G11C 16/30* (2013.01); *G11C 16/08* (2013.01); *G11C 16/0483* (2013.01)

(58) Field of Classification Search
CPC .... G11C 16/0483; G11C 16/08; G11C 16/30
USPC .......................... 365/185.16, 185.18, 185.23
See application file for complete search history.

(56) References Cited

U.S. PATENT DOCUMENTS

| | | | |
|---|---|---|---|
| 5,828,607 A | 10/1998 | Bushey et al. | |
| 6,172,918 B1 * | 1/2001 | Hidaka | G11C 7/1012 365/189.05 |
| 6,356,481 B1 | 3/2002 | Micheloni et al. | |
| 6,512,703 B2 * | 1/2003 | Sakui | G11C 16/10 365/189.05 |
| 6,621,745 B1 | 9/2003 | Manea | |
| 8,514,636 B2 * | 8/2013 | Kamata | G11C 11/5642 365/189.05 |
| 8,520,465 B2 * | 8/2013 | Hatsuda | G11C 16/0483 365/233.1 |
| 8,737,137 B1 | 5/2014 | Choy et al. | |
| 2004/0201059 A1 * | 10/2004 | Ding | H01L 29/42324 257/315 |

* cited by examiner

*Primary Examiner* — Ly D Pham

(57) ABSTRACT

A nonvolatile memory includes a memory array having a plurality of memory cells, a select gate driver configured to provide a select gate voltage to a select gate of a first memory cell of the plurality of memory cells, and a control gate driver configured to use the select gate voltage to provide a control gate voltage to a control gate of a second memory cell of the plurality of memory cells.

20 Claims, 3 Drawing Sheets

TABLE 1

| BANK | ERASE SECTOR | MODE | CASE | $V_X$ | $N_C$ | $N_A$ | $N_B$ | CG <i> | CG <#i> | SOURCE |
|---|---|---|---|---|---|---|---|---|---|---|
| SELECTED | SELECTED | PROG | SELECT GATE <i> ON | 1.5 | 1 | 0 | 8.5 | 8.5 | 1.5 | 5 |
| SELECTED | SELECTED | PROG | SELECT GATE <#i> OFF | 1.5 | 0 | 8.5 | 1.5 | 1.5 | 1.5 | 5 |
| SELECTED | UNSELECTED | PROG | SELECT GATE <i> OFF | 0 | 0 | 1.5 | 1.5 | 1.5 | 1.5 | 5 |
| SELECTED | SELECTED | ERASE | SELECT GATE <ALL> ON | 1.5 | 1 | 0 | 14 | 14 | 14 | 0 |
| SELECTED | UNSELECTED | ERASE | SELECT GATE <ALL> OFF | 1.5 | 0 | 14 | 1.5 | 1.5 | 1.5 | 0 |
| SELECTED | SELECTED | PROG VERIFY | SELECT GATE <i> ON | 1.5 | 1 | 0 | 2.7 | 2.7 | 1.5 | 0 |
| SELECTED | SELECTED | PROG VERIFY | SELECT GATE <#i> OFF | 1.5 | 0 | 2.7 | 1.5 |  | 1.5 | 0 |
| SELECTED | SELECTED | ERASE VERIFY | SELECT GATE ON/OFF | 1.2 | 1/0 | 5 | 1.2 | 1.2 | 1.2 | 0 |
| SELECTED | SELECTED | READ | SELECT GATE ON/OFF | 1.5 | 1/0 | 5 | 1.5 | 1.5 | 1.5 | 0 |

FIG. 4

SYSTEMS AND METHODS FOR DRIVING A CONTROL GATE WITH A SELECT GATE SIGNAL IN A SPLIT-GATE NONVOLATILE MEMORY CELL

BACKGROUND

1. Field

This disclosure relates generally to nonvolatile memory cells, and more specifically, to driving a control gate with a select gate signal in a split-gate nonvolatile memory cell.

2. Related Art

Within a split gate memory cell array, each row of memory cells may be coupled to a control gate driver which drives a required voltage level onto the control gates of the split gate memory cells in accordance with the desired operation. For example, the voltage applied to the control gate of a memory cell depends on whether the desired operation of that memory cell is a program select operation, a program deselect operation, an erase operation, an erase verify operation, a program verify operation, etc. For some operations, decoding information at high voltage is required for the control gate of the memory cell. Control gate drivers typically have to drive more than 1 row of control gates in order to reduce layout area. However, this may result in high voltages being applied to other control gates within the array even when the particular memory cell is not the subject of the instant operation. Therefore, a need exists for an improved control gate driver to reduce disturb levels at the control gate.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 4 illustrates a table of illustrative values for Nodes A, B, and C, as well as values on the control gate for a selected gate (e.g., CG<i>), values on the control gate for an unselected gate (e.g., CG<#i>), and the value for the source voltage.

DETAILED DESCRIPTION

In certain memory circuit architectures, split gates may be employed. With some split-gate architectures, there may be a disadvantage of applying relatively high voltage levels to memory cells that may not be part of a current memory operation. For example, depending on the memory operation, voltages ranging from 0-9 V may be applied. This may be desirable for the memory cells subject to the operation, but may lead to undesirable levels of disturb for those memory cells that are not immediately subject to the operation. One limitation that may be imposed by this problem may be a limitation on the size of a sector of memory cells selected for programming.

In some embodiments of the present disclosure, gate disturb may be reduced without limitation of unselected row and/or unselected column considerations. One approach may be to use a select gate voltage in order to provide a control gate voltage to a control gate. This may allow for using the select gate as a route for control gate decoding information.

Figure 1:
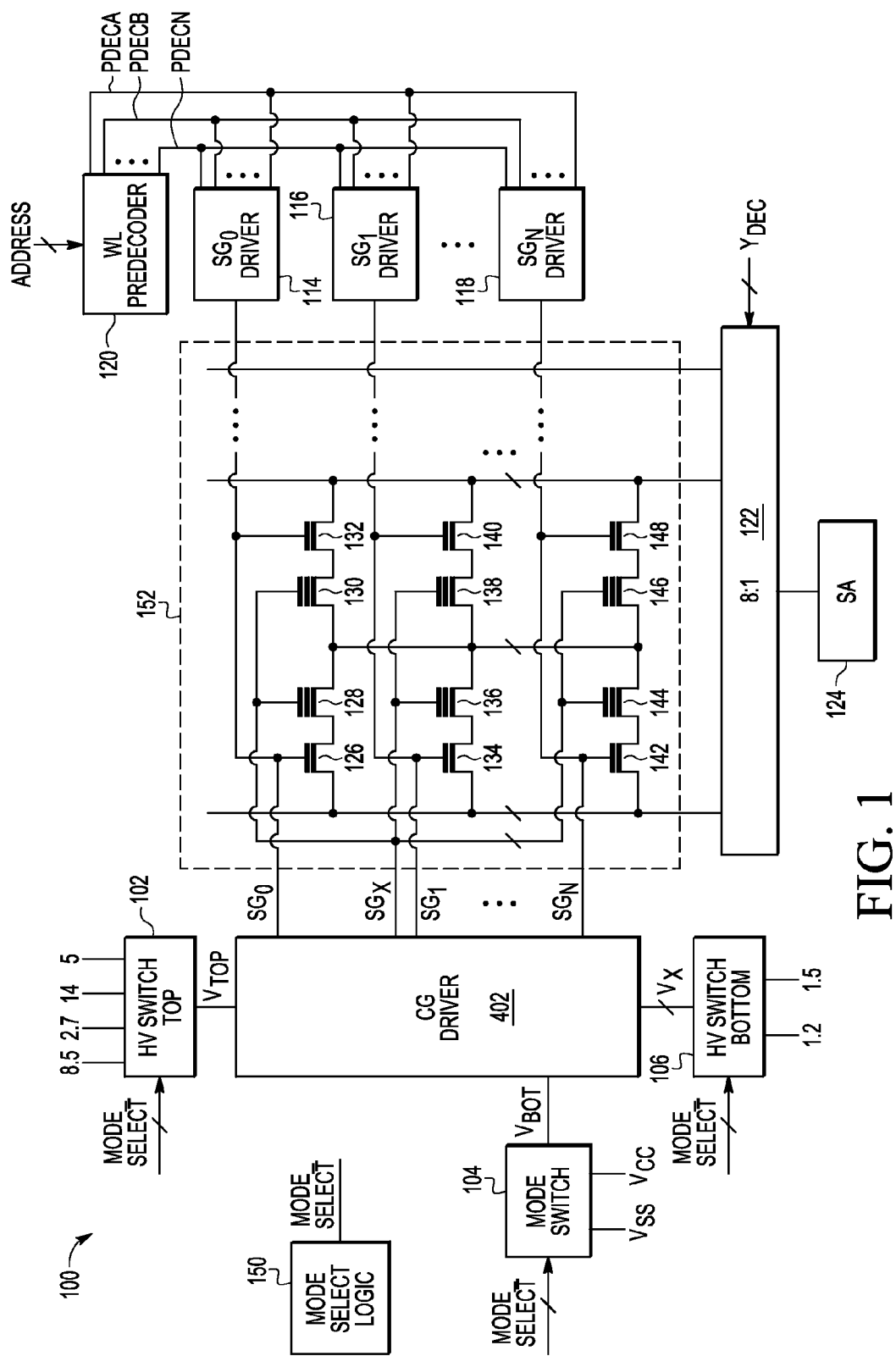
FIG. 1 illustrates a method to mitigate program disturb in split gate memory arrays, in accordance with certain embodiments of the present invention.

FIG. 1 illustrates a split gate memory 100 which mitigates program disturb, in accordance with certain embodiments of the present invention. Memory 100 may include memory array 152 including a plurality of memory cells 126, 128, 130, 132, 134, 136, 138, 140, 142, 144, 146, 148. Memory 100 may also include a plurality of select gate drivers 114, 116, 118, each coupled to a respective row of memory array 152. Although three select gate drivers 114, 116, 118 (and three respective rows of memory array 152) are illustrated, more, fewer, or different select gate drivers may be present without departing from the scope of the present invention. Memory 100 may also include multiplexing circuitry 122 coupled to memory array 152, as well as control gate driver 402 coupled to memory array 152.

In some embodiments, memory array 152 may include a plurality of split-gate memory cells. For example, memory array 152 may include a memory cell made up of transistors 126, 128, wherein transistor 126 operates as a select gate for a memory cell and transistor 128 operates as a control gate for the same memory cell. Another memory cell may be made of up transistors 130, 132, wherein transistor 130 operates as a control gate for the another memory cell, while transistor 132 operates as a select gate for the another memory cell. In such a configuration (or other configurations made up of more, fewer, or different transistors), memory array 152 may be made up of multiple rows of memory cells, as well as multiple columns.

In some embodiments, each memory cell of memory array 152 may also be coupled to multiplexing circuitry 122, which may be further coupled to sense amplifier 124. Multiplexing circuitry 122 may be operable to, in a read operation of memory 100, receive an output voltage from each memory cell of memory array 152 and, based on a detection signal (e.g., Ydec, a signal indicating which column of memory array 152 is active), communicate that voltage to sense amplifier 124 for further use by memory 100.

The selection of an individual memory cell within memory array 152 may be based on the activation of both the select gate and control gate of the particular memory cell. In some embodiments of the present disclosure, as described in more detail below with reference to FIGS. 2-4, a voltage applied to the control gates may be kept constant across all memory cells within memory array 152. However, the control gate voltage may be based on a select gate voltage, with other parameters modified based on the particular memory operation being performed by memory 100.

In some embodiments, select gate drivers 114, 116, 118 may be any circuitry, component, or group of circuitry and components configured to provide a select gate voltage to a row of memory array 152 in response to one or more pre-decoded address signal(s). For example, memory 100 may also include pre-decoding circuitry 120. In some embodiments, pre-decoding circuitry 120 may be any appropriate circuitry configured to pre-decode a plurality of incoming address signals into one or more pre-decode signals (e.g., pdeca, pdecb, pdecn), with each pre-decode signal being communicated to one or more select gate driver(s) 114, 116, 118. For example, pre-decode circuitry 120 may be configured to pre-decode a plurality of address signals to a level associated with a row or wordline of memory array 152. Each wordline pre-decode signal output may then be communicated to a respective wordline select gate driver (e.g., pdeca to select gate driver 114; pdecb to select gate driver 116; pdecn to select gate driver 118).

As described in more detail below with reference to FIGS. 2-4, the outputs of select gate drivers 114, 116, 118 may also be communicated to control gate driver 402 and used as a route for control gate driver 402 to decode information. In some embodiments, control gate driver 402 may be any appropriate circuitry (e.g., the circuitry described in more detail below with reference to FIGS. 2-3) configured to use a select gate voltage (e.g., $SG_0$, $SG_1$, $SG_N$) to provide a control gate voltage (e.g., $CG_X$) to a control gate.

In some embodiments, control gate driver 402 may be coupled to first high voltage switch circuit 102, second high voltage switch circuit 106, and mode switch 104. As described in more detail below with reference to FIGS. 2-4, high voltage switch circuits 102, 106 may be any appropriate switching circuitry configured to provide a relatively high voltage signal between or among a plurality of voltage options based on one or more mode select signals. For example, first high voltage switch circuit 102 (e.g., HV Switch Top) may be configured to provide 8.5 V, 2.7V, 14 V, or 5 V depending on one or more mode select signals (e.g., Mode_Select). These values may be associated with one or more memory operations of memory 100. For example, 8.5 V may be associated with a program operation, 2.7 V with a program verify operation, 14 V with an erase operation, 5 V with an erase verify operation, and 5 V with a read operation. Similarly, second high voltage switch circuit 106 (e.g., HV Switch Bot) may be configured to provide 1.2 V or 1.5 V depending on one or more mode select signals (e.g., Mode_Select). These values may be associated with one or more memory operations of memory 100. For example, 1.5 V may be associated with program, program verify, erase, and read operations, while 1.2 V may be associated with an erase verify operation. Although certain voltage values are described herein in order to aid in understanding, one of ordinary skill in the art would understand that more, fewer, or different voltage values may be provided without departing from the scope of the present disclosure.

In some embodiments, control gate driver 402 may also be coupled to mode switch 104. Mode switch 104 may be any appropriate circuitry configured to provide one or more voltage supplies (e.g., $V_{SS}$, $V_{CC}$) to control gate driver 402 based on one or more mode select signals (e.g., Mode_Select). The one or more mode select signals may be provided, in some embodiments, by mode select logic 150. Mode select logic 150 may be any appropriate circuitry, component, or combination thereof configured to provide one or more mode select signals based on the desired memory operation of memory 100. Mode select logic 150 may be an integral part of memory 100 or may be located within another portion or component of a semiconductor device including memory 100 or another semiconductor device coupled to memory 100.

Figure 2:
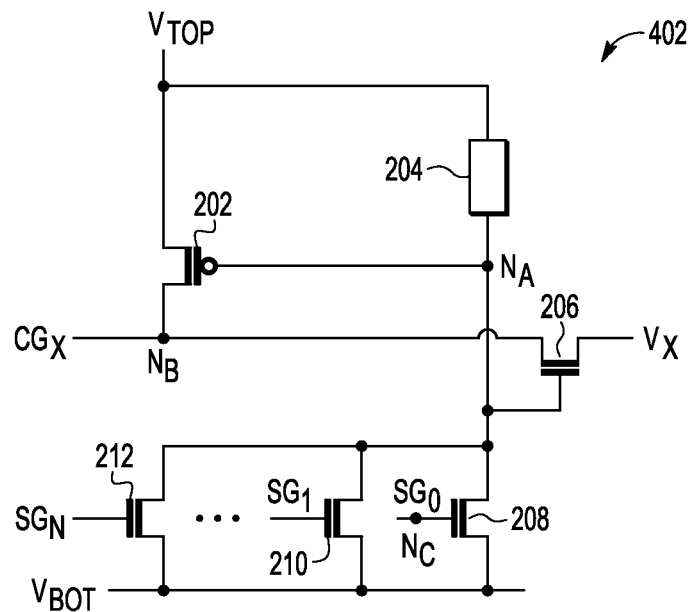
FIG. 2 illustrates an example control gate driver configured to provide a control gate voltage using a select gate voltage as an input, in accordance with certain embodiments of the present invention.
Figure 3:
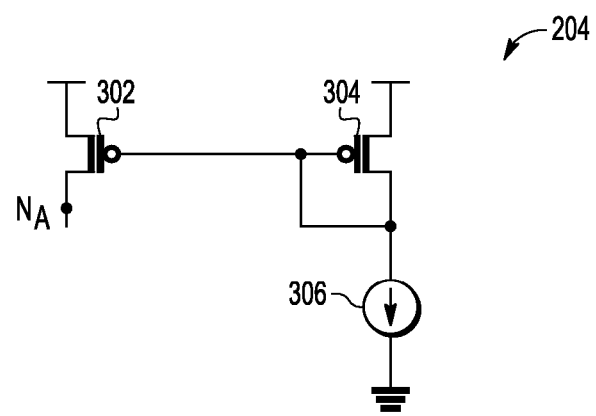
FIG. 3 illustrates an example variable resistance element, in accordance with certain embodiments of the present invention.

FIG. 2 illustrates an example control gate driver 402 configured to provide a control gate voltage using a select gate voltage as an input, in accordance with certain embodiments of the present disclosure. In some embodiments, control gate driver 402 may include transistor 202 coupled to resistive element 204 and transistor 206. These elements may be further coupled to a plurality of transistors 208, 210, 212, with each of transistors 208, 210, 212 associated with a respective select gate signal (e.g., outputs from select gate drivers 114, 116, 118, as described in more detail above with reference to FIG. 1).

As described in more detail above with reference to FIG. 1, in some embodiments, control gate driver 402 may receive as inputs first and second high voltage values (e.g., $V_{TOP}$, $V_X$), as well as a source voltage value (e.g., $V_{BOT}$). These values may be received from external switch devices (e.g., first high voltage switch 102, second high voltage switch 106, mode switch 104). The voltage received may depend upon the desired memory operation associated with memory 100. In the same or alternative embodiments, some or all of the necessary or desired switching circuitry may be incorporated into control gate driver 402, incorporated with one another, or incorporated into any other appropriate switching block either within or without memory 100.

In some embodiments, transistor 202 may be a p-type transistor having a first current electrode coupled to an output of first high voltage switch 102 (e.g., $V_{TOP}$), a second current electrode coupled to an output of control gate driver 402, and a control electrode coupled to a terminal of resistive element 204. To aid in understanding, the node at which the second current electrode of transistor 202 is coupled to the output of control gate driver 402 may be referred to as "node B" or "$N_B$," while the node at which the control electrodes of transistors 202 and 206 is coupled may be referred to as "node A" or "$N_A$."

In some embodiments, resistive element 204 may be an element with a relatively high resistance value. Resistive element 204 may also be a variable resistive element, as described in more detail below with reference to FIG. 3. Resistive element 204 may have a first terminal coupled to an output of first high voltage switch 102 (e.g., $V_{TOP}$) and a second terminal coupled to node A.

In some embodiments, control gate driver 402 may also include transistor 206. In some configurations, transistor 206 may be an n-type transistor having a first current electrode coupled to node B, a second current electrode coupled to an output of second high voltage switch 106 (e.g., $V_X$), and a control electrode coupled to plurality of transistors 208, 210, 212. To aid in understanding, the node at which the select gate of interest is coupled to transistor 208, 210, or 212 may be referred to as "node C" or "$N_C$." In one embodiment, assuming the select gates of row 0 (corresponding to $SG_0$) are of interest, node C would be synonymous with the control electrode of transistor 208 which is electrically connected to the select gates of row 0 (e.g. control electrodes of transistors 126 and 132).

In some embodiments, control gate driver 402 may also include a plurality of transistors 208, 210, 212, with each of transistors 208, 210, 212 associated with one or more rows of memory array 152 (e.g., one or more wordlines of memory array 152). Each of transistors 208, 210, 212 may have a first current electrode coupled to node A, a control electrode coupled to a corresponding one of $SG_0$ to $SG_N$, and a second current electrode coupled to an output of mode switch 104 (e.g., $V_{BOT}$).

In operation, control gate driver 402 receives a select gate voltage provided by a select gate driver to a select gate of a memory cell and level shifts the received select gate voltage to provide a control gate voltage. In one embodiment, the select gate voltage is used as an input by control gate driver 402 to provide the control gate voltage to the same memory cell which receives the select gate voltage. In an alternate embodiment, the control gate voltage is provided to a different memory cell, or may be provided to the control gates of each memory cell of a plurality of memory cells, including the memory cell which receives the select gate voltage. Furthermore, as illustrated in FIG. 2, control gate driver 402 may receive a select gate from one or more memory rows (e.g. one or more of $SG_0$-$SG_N$) to generate the control gate voltage $CG_X$. In this embodiment, transistors 208-212 performs an ORing operation on the corresponding select gate voltages ($SG_0$-$SG_N$), and a result of this ORing is level shifted to provide the control gate voltage $CG_X$.

The interoperability of components 202, 204, 206, 208, 210, 212 may be better understood with reference to TABLE 1 of FIG. 4. Assume for illustrative purposes of TABLE 1 that transistors 208, 210, and 212 are only represented by 1 transistor and the control electrode is shorted to a select gate (SG) signal as well as node C. TABLE 1 illustrates illustrative values for Nodes A, B, and C, as well as values on the control gate for a selected gate (e.g., CG<i>), values on the control gate for an unselected gate (e.g., CG<#i>), and the value for the source voltage (e.g., $V_{BOT}$, or Source). As described in more detail above with reference to FIG. 1, the values of $V_{TOP}$ and $V_X$ may vary depending on the desired memory operation of memory 100. For example, in a program mode for memory 100, a given sector of memory array 152 may be selected or unselected. In the illustrative example provided by TABLE 1, when the select gate for a particular portion of memory array 152 (e.g., a wordline or row of memory array 152) is ON (e.g., driven active by a select gate driver 114, 116, 118), the control gate voltage for that particular portion is relatively high (e.g., 8.5 V), while the control gate voltage for the non-selected portion is relatively low (e.g., 1.5 V). For the same memory operation, when the select gate for a particular portion is OFF (e.g., not drive active or driven inactive by a select gate driver 114, 116, 118), the control gate voltage for that portion will be 1.5 V, substantially the same as the relatively low control gate voltage for the non-selected portion.

Based on the selected voltages applied to outputs of high voltage switches 102, 106 and subsequently received at control gate driver 402, the control gate voltage received at individual memory cells of memory array 152 may vary. By using the select gate voltage as an input to control gate driver 402 as well, the voltages applied to control gates of non-selected portions of memory array 152 may be relatively lower than what may normally be applied in other memory configurations.

Referring again to FIG. 2, resistive element 204 may, in some embodiments, be a variable resistance element. FIG. 3 illustrates an example variable resistance element 204, in accordance with certain embodiments of the present disclosure. In some embodiments, resistive element 204 may include transistor 302, coupled to transistor 304 an current source 306.

In some embodiments, transistors 302, 304 may be of the same or different transistor types. In the illustrated example variable resistance element 204, transistors 302, 304 are both p-type MOSFETs. In some embodiments, transistor 302 may have a first current electrode coupled to an output of first high voltage switch 102 (e.g., $V_{TOP}$), a second current electrode coupled to node A, and a control electrode coupled to a control electrode of transistor 304 and current source 306. In some embodiments, current source 306 may be replaced with a resistor.

In some embodiments, transistor 304 may have a first current electrode coupled to an output of first high voltage switch 102 (e.g., $V_{TOP}$), a second current electrode coupled to a terminal of current source 306, and a control electrode coupled to the second current electrode and to the same terminal of current source 306 as the second current electrode.

In some embodiments, current source 306 may be any appropriate current source for inclusion in resistive element 204. Current source 306 may have a first terminal coupled to a current electrode and a control electrode of transistor 304, and may have a second terminal coupled to a reference voltage level (e.g., ground).

In such a manner, various systems and methods may be incorporated which allows for mitigation in program disturb in split-gate nonvolatile memory cell arrays. One way in which the disturb may be mitigated is by incorporating a common memory gate potential through the use of a select gate-controlled control gate voltage applied to the various memory cells that may otherwise be subject to a relatively high voltage during a program memory operation. As can be seen from the embodiments described herein, a select gate voltage is provided as input to the control gate driver, in which the control gate driver level shifts the received select gate voltage to generate the control gate voltage, which can be applied to the control gates of each memory cell within a bank of memory cells of the memory array. Alternatively, multiple select gate voltages may be provided as inputs to the control gate driver, in which the multiple select gate voltages are used to generate a voltage which is level shifted to generate the control gate voltage. Note that, in this manner, the on or more physical select gate voltage lines, at an opposite end of the memory array as the SG drivers, provide the routing such that no extra routing of the decoder outputs from decoder 120 to the control gate driver is needed. Therefore, a control gate driver having a more compact layout which reduces disturb levels at the control gate can be achieved by enabling decode granularity to help isolate the control gates from high voltage exposure.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

By now it should be appreciated that there has been provided various memory circuits, and methods of operating said memory circuits, including a memory array 152 having a plurality of memory cells 126, 128, 130, 132, 134, 136, 138, 140, etc.; a select gate driver 114 configured to provide a select gate voltage to a select gate of a first memory cell of the plurality of memory cells; and a control gate driver 402 configured to use the select gate voltage to provide a control gate voltage to a control gate of a second memory cell of the plurality of memory cells.

In some embodiments, the control gate driver may be configured to level shift the select gate voltage provided by the select gate driver and use the level shifted select gate voltage to provide the control gate voltage. In the same or alternative embodiments, the first memory cell and the second memory cell are a same memory cell, located in different rows of the memory array, and/or are located in different columns of the memory array.

In some embodiments, the control gate driver may be configured to provide the control gate voltage at an output node (e.g., $N_B$) of the control gate driver. This control gate driver may include: a first transistor 202 of a first conductivity type having a first current electrode coupled to a first voltage supply node (e.g., $V_{TOP}$), a control electrode, and a second current electrode coupled to the output node; and a second transistor 208 of a second conductivity type having a first current electrode coupled to the control electrode of the first transistor, a control electrode coupled to the select gate, and a second current electrode coupled to a second voltage supply node ($V_{BOT}$).

In such a configuration, the nonvolatile memory may further include: a resistive element 204 coupled between the first current electrode and the control electrode of the first transistor; and a third transistor 206 of the second conductivity type having a first current electrode coupled to the output node, a control electrode coupled to the first current electrode of the second transistor, and a second control electrode coupled to a third voltage supply node. In some embodiments, the resistive element may include: a fourth transistor 302 of the first conductivity type having a first current electrode coupled to the first voltage supply node, a second current electrode coupled to the control electrode of the first transistor, and a control electrode coupled to receive a bias voltage. The memory may further include a first voltage supply switch 102 configured to select a first voltage level provided by the first voltage supply node; a second voltage supply switch 104 configured to select a second voltage level provided by the second voltage supply node; and a third voltage supply switch 106 configured to select a third voltage level provided by the third voltage supply node. First voltage supply switch 102 may be configured to select a first voltage level provided by the first voltage supply node; and second voltage supply switch 104 may be configured to select a second voltage level provided by the second voltage supply node.

In some embodiments, the select gate driver may be configured to provide a corresponding select gate voltage to each select gate of a first plurality of memory cells (e.g. 126 and 132), and wherein the control gate driver is configured to use the corresponding select gate voltages (e.g., 208-212) to provide the control gate voltage.

In some embodiments, a highest absolute voltage level of the select gate voltage is less than a highest absolute voltage level of the control gate voltage.

In other embodiments of a nonvolatile memory, the memory may include: a memory array 152; a select gate driver 114 coupled to a select gate of a first memory cell of the memory array; and a control gate driver 402 coupled to a control gate of a second memory cell. The control gate driver may include: a first transistor 202 of a first conductivity type having a first current electrode coupled to a first voltage supply node (e.g., $V_{TOP}$), a control electrode, and a second current electrode coupled to a driver output node (e.g., $N_B$) configured to drive a control gate voltage to the control gate of the second memory cell; a second transistor 208 of a second conductivity type having a first current electrode coupled to the driver output node, a control electrode coupled to the control electrode of the first transistor, and a second current electrode coupled to a second voltage supply node ($V_{BOT}$); a resistive element 204 coupled between the first current electrode and the control electrode of the first transistor; and a third transistor 206 of the second conductivity type having a first current electrode coupled to the driver output node, a control electrode coupled to the first current electrode of the second transistor, and a second control electrode coupled to a third voltage supply node (e.g., $V_X$). In some embodiments, the first memory cell and the second memory cell are a same memory cell.

In some embodiments, the resistive element may include a fourth transistor 302 of the first conductivity type having a first current electrode coupled to the first voltage supply node, a second current electrode coupled to the control electrode of the first transistor, and a control electrode coupled to receive a bias voltage.

In the same or alternative embodiments, the memory may include a first voltage supply switch 102 configured to select a first voltage level provided by the first voltage supply node; a second voltage supply switch 104 configured to select a second voltage level provided by the second voltage supply node; and a third voltage supply switch 106 configured to select a third voltage level provided by the third voltage supply node. Such a configuration may also include mode select logic 150 coupled to provide a mode select signal to the first and second voltage supply, wherein the first voltage supply switch is configured to select the first voltage level from a first plurality of voltage levels based on the mode select signal and the second voltage supply switch is configured to select the second voltage level from a second plurality of voltage levels based on the mode select signal. The mode select logic may be configured to provide the mode select signal based on an operation mode of the nonvolatile memory.

Certain methods are also disclosed. For example, a method of operating a nonvolatile memory, wherein the method may include: providing a select gate voltage (e.g., by 114) to a select gate of a first memory cell in the nonvolatile memory; using the select gate voltage to provide a control gate voltage (e.g., by 402) to a control gate of a second memory cell in the nonvolatile memory.

In some embodiments, using the select gate voltage to provide the control gate voltage may include level shifting the select gate voltage and providing the level shifted select gate voltage as the control gate voltage.

In the same or alternative embodiments, the method may also include providing a corresponding select gate voltage to each select gate of a first plurality of memory cells in the nonvolatile memory; performing an ORing operation (e.g. 208-212) on the corresponding select gate voltages, wherein using the select gate voltage to provide the control gate voltage to the control gate of the second memory cell comprises using a result of the ORing operation to provide the control gate voltage.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, array 116 may include more, fewer, or different memory cells than those illustrated in FIG. 1, and each cell may include more, fewer, or different components than those illustrated in FIG. 1. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A nonvolatile memory comprising:
a memory array having a plurality of memory cells;
a select gate driver configured to provide a select gate voltage to a select gate of a first memory cell of the plurality of memory cells; and
a control gate driver configured to use the select gate voltage to provide a control gate voltage to a control gate of a second memory cell of the plurality of memory cells.

2. The nonvolatile memory of claim 1, wherein the control gate driver is configured to level shift the select gate voltage provided by the select gate driver and use the level shifted select gate voltage to provide the control gate voltage.

3. The nonvolatile memory of claim 1, wherein the first memory cell and the second memory cell are a same memory cell.

4. The nonvolatile memory of claim 1, wherein the first memory cell and the second memory cell are located in different rows of the memory array.

5. The nonvolatile memory of claim 1, wherein the first memory cell and the second memory cell are located in different columns of the memory array.

6. The nonvolatile memory of claim 1, wherein the control gate driver is configured to provide the control gate voltage at an output node of the control gate driver and comprises:
a first transistor of a first conductivity type having a first current electrode coupled to a first voltage supply node, a control electrode, and a second current electrode coupled to the output node; and
a second transistor of a second conductivity type having a first current electrode coupled to the control electrode of the first transistor, a control electrode coupled to the select gate, and a second current electrode coupled to a second voltage supply node.

7. The nonvolatile memory of claim 6, further comprising:
a resistive element coupled between the first current electrode and the control electrode of the first transistor; and
a third transistor of the second conductivity type having a first current electrode coupled to the output node, a control electrode coupled to the first current electrode of the second transistor, and a second control electrode coupled to a third voltage supply node.

8. The nonvolatile memory of claim 7, wherein the resistive element comprises:
a fourth transistor of the first conductivity type having a first current electrode coupled to the first voltage supply node, a second current electrode coupled to the control electrode of the first transistor, and a control electrode coupled to receive a bias voltage.

9. The nonvolatile memory of claim 7, further comprising:
a first voltage supply switch configured to select a first voltage level provided by the first voltage supply node;
a second voltage supply switch configured to select a second voltage level provided by the second voltage supply node; and
a third voltage supply switch configured to select a third voltage level provided by the third voltage supply node.

10. The nonvolatile memory of claim 6, further comprising,
a first voltage supply switch configured to select a first voltage level provided by the first voltage supply node; and
a second voltage supply switch configured to select a second voltage level provided by the second voltage supply node.

11. The nonvolatile memory of claim 1, wherein the select gate driver is configured to provide a corresponding select gate voltage to each select gate of a first plurality of memory cells, and wherein the control gate driver is configured to use the corresponding select gate voltages to provide the control gate voltage.

12. The nonvolatile memory of claim 1, wherein a highest absolute voltage level of the select gate voltage is less than a highest absolute voltage level of the control gate voltage.

13. A nonvolatile memory comprising:
a memory array;
a select gate driver coupled to a select gate of a first memory cell of the memory array;
a control gate driver coupled to a control gate of a second memory cell, wherein the control gate driver comprises:
a first transistor of a first conductivity type having a first current electrode coupled to a first voltage supply node, a control electrode, and a second current electrode coupled to a driver output node configured to drive a control gate voltage to the control gate of the second memory cell;
a second transistor of a second conductivity type having a first current electrode coupled to the driver output node, a control electrode coupled to the control electrode of the first transistor, and a second current electrode coupled to a second voltage supply node;
a resistive element coupled between the first current electrode and the control electrode of the first transistor; and
a third transistor of the second conductivity type having a first current electrode coupled to the driver output node, a control electrode coupled to the first current electrode of the second transistor, and a second control electrode coupled to a third voltage supply node.

14. The nonvolatile memory of claim 12, wherein the first memory cell and the second memory cell are a same memory cell.

15. The nonvolatile memory of claim 12, wherein the resistive element comprises:
 a fourth transistor of the first conductivity type having a first current electrode coupled to the first voltage supply node, a second current electrode coupled to the control electrode of the first transistor, and a control electrode coupled to receive a bias voltage.

16. The nonvolatile memory of claim 12, further comprising:
 a first voltage supply switch configured to select a first voltage level provided by the first voltage supply node;
 a second voltage supply switch configured to select a second voltage level provided by the second voltage supply node; and
 a third voltage supply switch configured to select a third voltage level provided by the third voltage supply node.

17. The nonvolatile memory of claim 16, further comprising:
 mode select logic coupled to provide a mode select signal to the first and second voltage supply, wherein the first voltage supply switch is configured to select the first voltage level from a first plurality of voltage levels based on the mode select signal and the second voltage supply switch is configured to select the second voltage level from a second plurality of voltage levels based on the mode select signal.

18. In a nonvolatile memory, a method comprising:
 providing a select gate voltage to a select gate of a first memory cell in the nonvolatile memory;
 using the select gate voltage to provide a control gate voltage to a control gate of a second memory cell in the nonvolatile memory.

19. The method of claim 18, wherein using the select gate voltage to provide the control gate voltage comprises:
 level shifting the select gate voltage; and
 providing the level shifted select gate voltage as the control gate voltage.

20. The method of claim 18, further comprising:
 providing a corresponding select gate voltage to each select gate of a first plurality of memory cells in the nonvolatile memory;
 performing an ORing operation on the corresponding select gate voltages, wherein using the select gate voltage to provide the control gate voltage to the control gate of the second memory cell comprises using a result of the ORing operation to provide the control gate voltage.

\* \* \* \* \*